United States Patent [19]
Mukai

[11] Patent Number: 5,100,834
[45] Date of Patent: Mar. 31, 1992

[54] METHOD OF PLANARIZING METAL LAYER

[75] Inventor: Ryoichi Mukai, Kawasaki, Japan

[73] Assignee: Fujitsu Limited, Kawasaki, Japan

[21] Appl. No.: 671,227

[22] Filed: Mar. 19, 1991

[30] Foreign Application Priority Data

Mar. 20, 1990 [JP] Japan .................. 2-70897

[51] Int. Cl.⁵ .................. H01L 21/268; H01L 21/283
[52] U.S. Cl. .................. 437/173; 437/203; 148/DIG. 93
[58] Field of Search .......... 148/DIG. 50, DIG. 93; 437/173, 174, 228, 245, 249, 902, 194, 203

[56] References Cited

U.S. PATENT DOCUMENTS 4,920,070 4/1990 Mukai .................. 437/173

FOREIGN PATENT DOCUMENTS

| | | |
|---|---|---|
| 61-102723 | 5/1986 | Japan .................. 437/173 |
| 61-256635 | 11/1986 | Japan . |
| 63-27013 | 2/1988 | Japan . |
| 63-41020 | 2/1988 | Japan . |
| 63-160330 | 7/1988 | Japan . |
| 63-215055 | 9/1988 | Japan .................. 432/123 |
| 2-27711 | 1/1990 | Japan . |
| 02-137344 | 5/1990 | Japan .................. 437/173 |

Primary Examiner—Olik Chaudhuri
Assistant Examiner—Andrew Griffis
Attorney, Agent, or Firm—Armstrong, Nikaido, Marmelstein, Kubovcik & Murray

[57] ABSTRACT

A planarization method includes the steps of forming a second layer on a first layer which has an alignment mark having a heat sink structure, where the second layer is made of a metal, and irradiating a pulse energy beam on the entire exposed surface of the second layer to planarize the second layer. The heat generated in the second layer on the alignment mark is released via the first layer so that substantially no melting of the second layer occurs on the alignment mark.

30 Claims, 5 Drawing Sheets

METHOD OF PLANARIZING METAL LAYER

BACKGROUND OF THE INVENTION

The present invention generally relates to planarization methods, and more particularly to a method of planarizing a metal layer by a pulse energy beam such as a pulse laser beam. The method of the present invention is especially suited for planarizing a metal interconnection layer.

When forming a metal interconnection layer during a process of producing an integrated circuit, a conductor layer 4 shown in FIG. 1 is formed on an insulator layer 2 which is provided on a semiconductor layer 1 by a vapor deposition, sputtering or the like. However, as a via hole 5 such as a contact hole and a through hole in the insulator layer 2 becomes smaller, the conductor layer 4 does not sufficiently fill the via hole 5 and the step coverage becomes poor. This poor step coverage is caused by the fact that it becomes difficult for the conductor layer 4 to adhere on the sidewall of the via hole 5 due to the shadowing effect.

FIG. 2 is a cross sectional view for explaining a proposed method of eliminating the poor step coverage described above. According to this proposed method, a laser beam is irradiated on the conductor layer 4 to melt and planarize the conductor layer 4.

On the other hand, FIGS. 3 and 4 are cross sectional views for explaining a proposed method of forming a plug to eliminate the problem of poor step coverage. According to this proposed method, the conductor layer 4 is formed in a vicinity of the via hole 5 as shown in FIG. 3, and a laser beam is irradiated on the conductor layer 4 to form a plug 6 within the via hole 5 by the melted conductor as shown in FIG. 4.

However, an alignment mark 3 is usually formed on the conductor layer 4 as shown in FIG. 5. This alignment mark 3 is used for aligning a mask relative to the conductor layer 4. When the laser beam irradiates the conductor layer 4, the laser beam irradiates the entire surface of the conductor layer 4 because the laser beam irradiation is made with respect to the conductor layer 4 on a wafer, for example, so as to improve the throughput of the device. For this reason, the alignment mark 3 is also planarized by the laser beam irradiation as shown in FIG. 6, and there is a problem in that the alignment mark 3 disappears when the planarization using the laser beam is carried out. On the other hand, if the laser beam irradiation is made to avoid the alignment mark 3, it is necessary to irradiate the laser beam on the conductor layer 4 on the wafer in parts, and the throughput of the device becomes poor because of the need to make several laser beam irradiations with respect to the conductor layer 4 on the wafer.

SUMMARY OF THE INVENTION

Accordingly, it is a general object of the present invention to provide a novel and useful planarization method in which the problem described above is eliminated.

Another and more specific object of the present invention is to provide a planarization method comprising the steps of forming a second layer on a first layer which has an alignment mark having a heat sink structure, where the second layer is made of a metal, and irradiating a pulse energy beam on the entire exposed surface of the second layer to planarize the second layer, where heat generated in the second layer on the alignment mark is released via the first layer so that substantially no melting of the second layer occurs on the alignment mark. According to the planarization method of the present invention, it is possible to prevent the alignment mark from being planarized by the energy beam irradiation. In addition, no alignment is required when carrying out the energy beam irradiation for the purpose of preventing the planarization of the alignment mark, and as a result, the throughput of the device is improved and the production cost is reduced.

Still another object of the present invention is to provide a planarization method comprising the steps of patterning one or a plurality of second layers which are formed on a first layer having an alignment mark so as to remove the one or the plurality of second layers on the alignment mark thereby exposing the alignment mark provided on the first layer, where the alignment mark has a heat sink structure, forming a third layer on a top one of the second layers and the exposed surface of the first layer, where the third layer is made of a metal, and irradiating a pulse energy beam on the entire exposed surface of the third layer to planarize the third layer, where heat generated in the third layer on the alignment mark is released via the first layer so that substantially no melting of the third layer occurs on the alignment mark.

A further object of the present invention is to provide a planarization method comprising the steps of patterning a second layer which is formed on a first layer so as to form an alignment mark having a heat sink structure thereby exposing a surface of the first layer, where the second layer is made of an insulator, forming a third layer on the second layer and the exposed surface of the first layer, and irradiating a pulse energy beam on the entire exposed surface of the third layer to planarize the third layer, where heat generated in the third layer on the alignment mark is released via the first layer so that substantially no melting of the third layer occurs on the alignment mark.

Another object of the present invention is to provide a planarization method comprising the steps of forming a second layer on a first layer which has an alignment mark, where the second layer is made of a metal, removing the second layer in a vicinity of the alignment mark, and irradiating a pulse energy beam on the entire exposed surface of the second layer to planarize the second layer.

Still another object of the present invention is to provide a planarization method comprising the steps of patterning one or a plurality of second layers which are formed on a first layer having an alignment mark so as to remove the one or the plurality of second layers on the alignment mark thereby exposing the alignment mark provided on the first layer, forming a third layer on a top one of the second layers and the exposed surface of the first layer, where the third layer is made of a metal, removing the third layer in a vicinity of the alignment mark, and irradiating a pulse energy beam on the entire exposed surface of the third layer to planarize the third layer.

A further object of the present invention is to provide a planarization method comprising the steps of patterning a second layer which is formed on a first layer so as to form at least an alignment mark thereby exposing a surface of the first layer, where the second layer being made of an insulator, forming a third layer on at least the second layer, removing the third layer in a vicinity of the alignment mark provided on the second layer, and irradiating a pulse energy beam on the entire exposed surface of the third layer to planarize the third layer.

Another object of the present invention is to provide a method of producing a semiconductor device comprising the steps of patterning one or a plurality of insulator layers which are formed on a semiconductor layer having an alignment mark and a semiconductor device so as to remove the one or the plurality of insulator layers on the alignment mark thereby exposing the alignment mark provided on the semiconductor layer, where said alignment mark has a heat sink structure, forming a metal layer on a top one of the insulator layers and the exposed surface of the semiconductor layer, and irradiating a pulse energy beam on the entire exposed surface of the metal layer to planarize the metal layer, where heat generated in the metal layer on the alignment mark is released via the semiconductor layer so that substantially no melting of the metal layer occurs on the alignment mark.

Still another object of the present invention is to provide a method of producing a semiconductor device comprising the steps of patterning an insulator layer which is formed on a semiconductor layer having a semiconductor device so as to form an alignment mark having a heat sink structure thereby exposing a surface of the semiconductor layer, forming a metal layer on the insulator layer and the exposed surface of the semiconductor layer, and irradiating a pulse energy beam on the entire exposed surface of the metal layer to planarize the metal layer, where heat generated in the metal layer on the alignment mark is released via the semiconductor layer so that substantially no melting of the metal layer occurs on the alignment mark.

A further object of the present invention is to provide a method of producing a semiconductor device comprising the steps of patterning one or a plurality of insulator layers which are formed on a semiconductor layer having an alignment mark and a semiconductor device so as to remove the one or the plurality of semiconductor layers on the alignment mark thereby exposing the alignment mark provided on the semiconductor layer, forming a metal layer on a top one of the insulator layers and the exposed surface of the semiconductor layer, removing the metal layer in a vicinity of the alignment mark, and irradiating a pulse energy beam on the entire exposed surface of the metal layer to planarize the metal layer.

Another object of the present invention is to provide a method of producing a semiconductor device comprising the steps of patterning an insulator layer which is formed on a semiconductor layer having a semiconductor element so as to form at least an alignment mark thereby exposing a surface of the semiconductor layer, forming a metal layer on at least the insulator layer, removing the metal layer in a vicinity of the alignment mark which is provided on the insulator layer, and irradiating a pulse energy beam on the entire exposed surface of the metal layer to planarize the metal layer.

Other objects and further features of the present invention will be apparent from the following detailed description when read in conjunction with the accompanying drawings.

DESCRIPTION OF THE PREFERRED EMBODIMENTS

Figure 1:
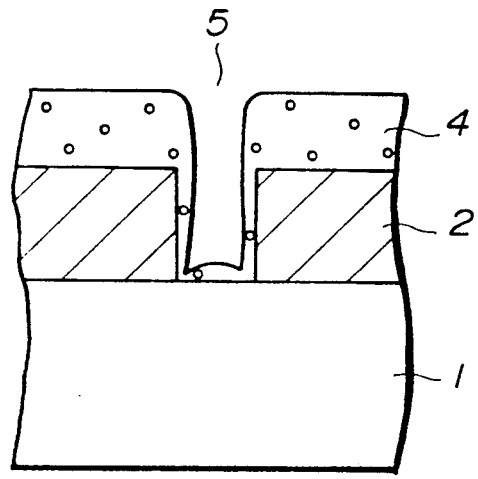
FIGS. 1 and 2 are cross sectional views for explaining a proposed method of planarizing a conductor layer.
Figure 2:
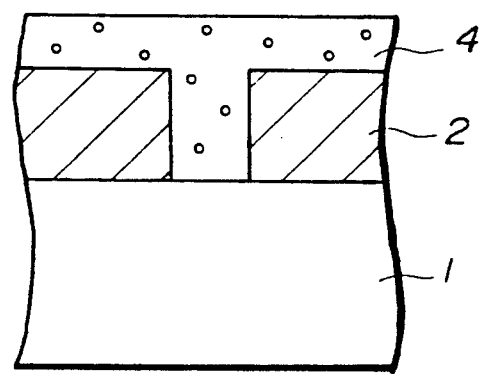
Figure 3:
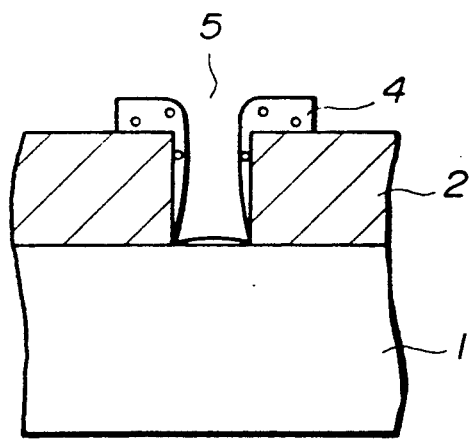
FIGS. 3 and 4 are cross sectional views for explaining a proposed method of forming a conductor plug.
Figure 4:
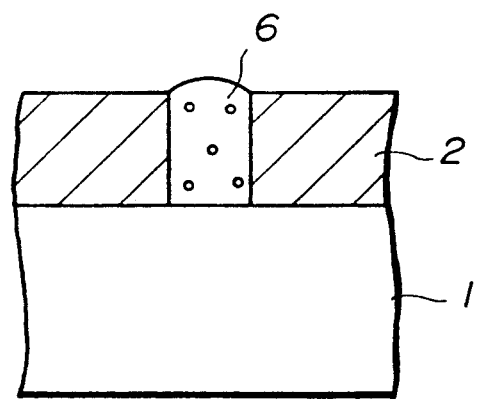
Figure 5:
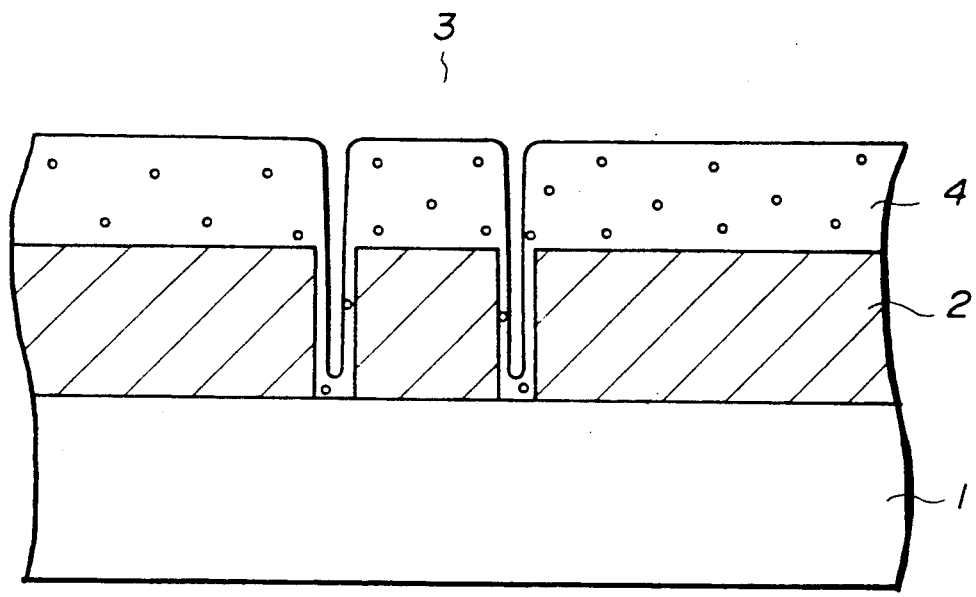
FIGS. 5 and 6 are cross sectional views for explaining unwanted planarization of a alignment mark.
Figure 6:
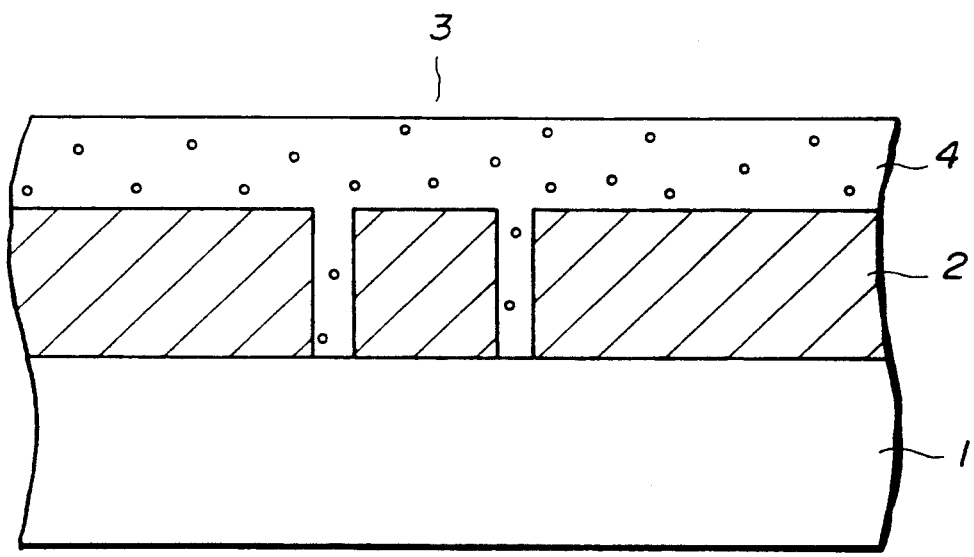
Figure 7:
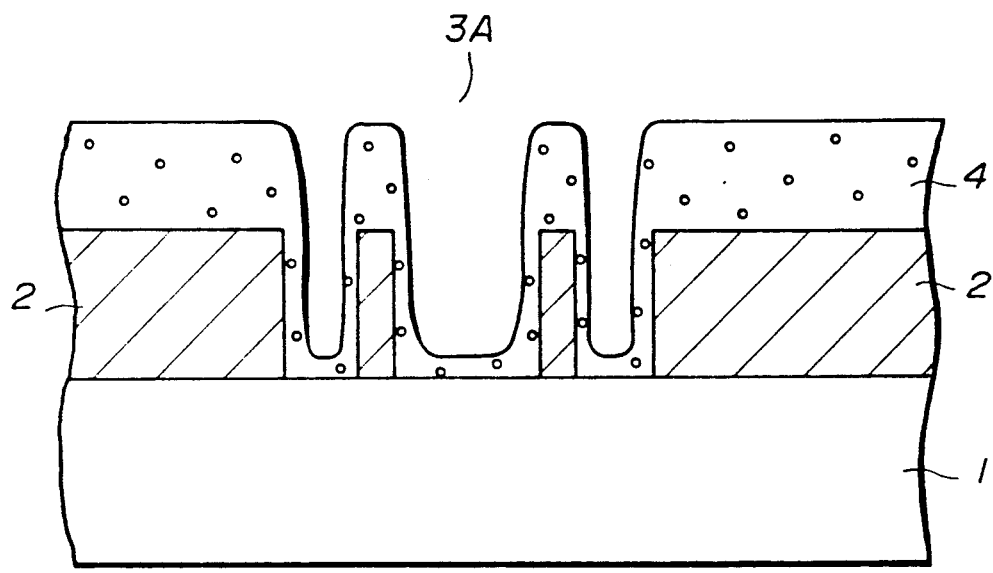
FIG. 7 is a cross sectional view for explaining a first embodiment of a planarization method according to the present invention.

First, a description will be given of a first embodiment of a planarization method according to the present invention, by referring to FIG. 7. In this embodiment, an insulator layer 2 is formed on a semiconductor substrate 1. For example, the insulator layer 2 is made of phospho-silicate glass (PSG) and has a thickness of 0.6 $\mu$m in this embodiment. The insulator layer 2 is patterned to form an alignment mark 3A and a via hole (not shown). The alignment mark 3A has a heat sink structure such that an area in which the insulator layer 2 is removed is sufficiently large.

A conductor layer 4 is formed on the entire surface of the insulator layer 2 and the exposed surface of the semiconductor substrate 1. For example, the conductor layer 4 is made of aluminum (Al) and has a thickness of 1.0 $\mu$m in this embodiment.

Thereafter, a XeCl excimer laser beam is irradiated on the conductor layer 4 with a pulse energy of 7 J/cm$^2$ to melt the Al. The melted Al completely fills the via hole and is planarized. On the other hand, the Al conductor layer 4 on the alignment mark 3A does not melt because the heat generated by the laser beam irradiation is released via the semiconductor substrate 1. In other words, because the irradiation is made by the pulse laser beam, the heat generated in the Al conductor layer 4 at the alignment mark 3A, that is, at the heat sink structure, is effectively released via the semiconductor substrate 1. As a result, the alignment mark 3A will not be planarized by the laser beam irradiation. The planarized conductor layer 4 is then patterned using the alignment mark 3A so as to form an interconnection layer, for example.

Figure 8:
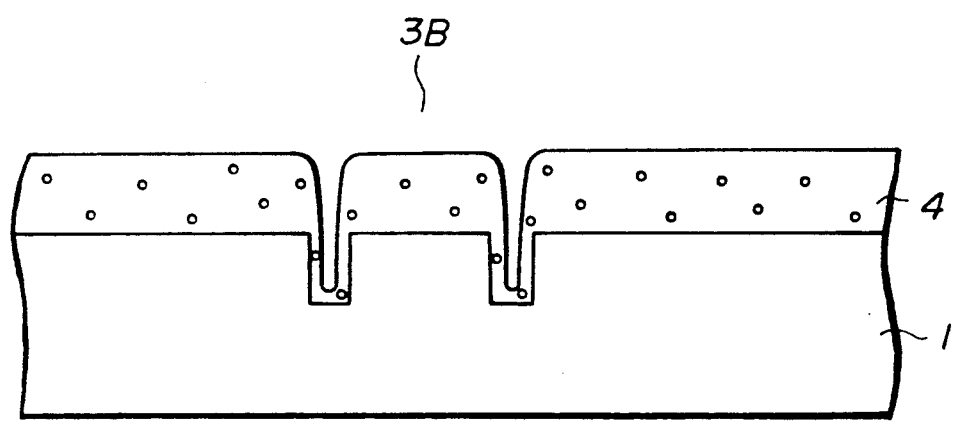
FIG. 8 is a cross sectional view for explaining a second embodiment of the planarization method according to the present invention.

Next, a description will be given of a second embodiment of the planarization method according to the present invention, by referring to FIG. 8. In FIG. 8 and FIGS. 9 through 11 which follow, those parts which are basically the same as those corresponding parts in FIG. 7 are designated by the same reference numerals, and a description thereof will be omitted.

In this embodiment, a groove pattern is formed in the semiconductor substrate 1 so as to form an alignment mark 3B having a heat sink structure. For example, the groove pattern has a depth of 0.5 $\mu$m. One or a plurality of layers may be formed on the semiconductor substrate 1 prior to forming the conductor layer 4. In such cases, each layer above the alignment mark 3B is removed when the layer is patterned before the conductor layer 4 is formed. For example, the conductor layer 4 is made of Al and has a thickness of 1.0 $\mu$m. A laser beam is irradiated on the conductor layer 4 similarly to the first embodiment, so as to planarize the conductor layer 4. However, the heat generated in the Al conductor layer 4 on the alignment mark 3B is released via the semiconductor substrate 1, and the Al conductor layer 4 in this region does not melt. Accordingly, the alignment mark 3B will not be planarized by the laser beam irradiation. The planarized conductor layer 4 is then patterned using the alignment mark 3B so as to form an interconnection layer, for example.

Figure 9:
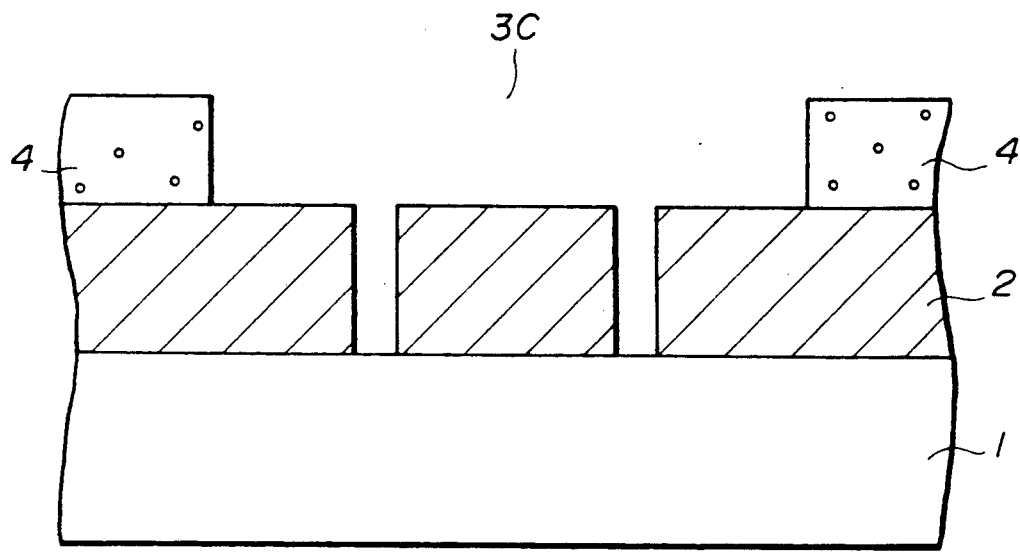
FIG. 9 is a cross sectional view for explaining a third embodiment of the planarization method according to the present invention.

Next, a description will be given of a third embodiment of the planarization method according to the present invention, by referring to FIG. 9. In this embodiment, the insulator layer 2 formed on the semiconductor substrate 1 is made of PSG and has a thickness of 0.6 μm. The insulator layer 2 is patterned to form an alignment mark 3C and a via hole (not shown). The conductor layer 4 is formed on the entire surface of the insulator layer 2 and the exposed surface of the semiconductor substrate 1. For example, the conductor layer 4 is made of Al. Thereafter, the conductor layer 4 is patterned to remove the conductor layer 4 on the alignment mark 3C.

Then, a laser beam is irradiated on the conductor layer 4 to melt the Al, similarly as in the case of the first embodiment. The melted Al completely fills the via hole and is planarized. On the other hand, the Al conductor layer 4 does not exist on the alignment mark 3C, and as a result, the alignment mark 3C will not be planarized by the laser beam irradiation. The planarized conductor layer 4 is then patterned using the alignment mark 3C so as to form an interconnection layer, for example.

Figure 10:
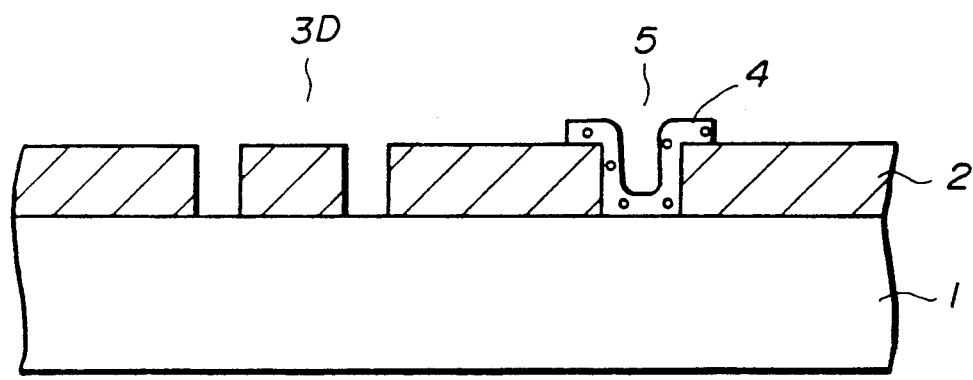
FIGS. 10 and 11 are cross sectional views for explaining a fourth embodiment of the planarization method according to the present invention.
Figure 11:
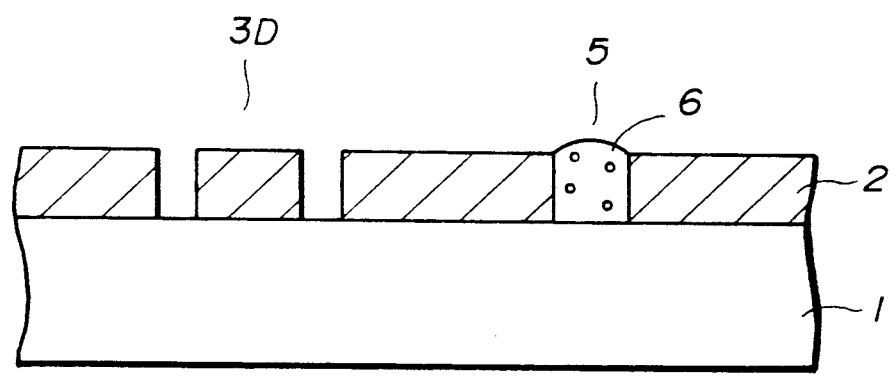

Next, a description will be given of a fourth embodiment of the planarization method according to the present invention, by referring to FIGS. 10 and 11. In this embodiment, the insulator layer 2 formed on the semiconductor substrate 1 is made of PSG and has a thickness of 0.6 μm. The insulator layer 2 is patterned to form an alignment mark 3D and a via hole 5. The conductor layer 4 is formed on the entire surface of the insulator layer 2 and the exposed surface of the semiconductor substrate 1. For example, the conductor layer 4 is made of Al. Thereafter, the conductor layer 4 is patterned so that the conductor layer 4 remains only in a vicinity of the via hole 5 as shown in FIG. 10.

Thereafter, a laser beam is irradiated on the conductor layer 4 to melt the Al, similarly as in the case of the first embodiment. The melted Al (conductor layer 4) in the vicinity of the via hole 5 flows into the via hole 5 and solidifies into a plug 6 as shown in FIG. 11. Since the conductor layer 4 does not exist on the alignment mark 3D, the alignment mark 3D will not be planarized. Then, an Al layer (not shown) which connects to the plug 6 is formed and patterned to form an interconnection layer, for example.

According to the third and fourth embodiments, no special process is required to prevent the planarization of the alignment marks 3C and 3D and the conductor layer 4 simply needs to be patterned to remove the conductor layer 4 in the vicinity of the alignment marks 3C and 3D Since the patterning of the conductor layer 4 is originally required to leave the conductor layer 4 at least in the vicinity of the via hole 5, the process of removing the conductor layer 4 in the vicinity of the alignment marks 3C and 3D may be carried out simultaneously as the patterning to avoid the unnecessary increase of production processes.

Of course, the conductor layer 4 in the vicinity of the alignment mark 3B shown in FIG. 8 may be removed prior to the laser beam irradiation, to obtain substantially the same effects as the third embodiment.

In the described embodiments, the conductor layer is made of Al. However, the conductor layer is not limited to Al, and any metal may be used. For example, titanium (Ti), copper (Cu), tungsten (W) and molybdenum (Mo) may be used for the conductor layer.

In addition, the melting of the conductor may of course be made by an energy beam other than the laser beam. However, it is desirable that the energy beam is a pulse energy beam.

Moreover, the semiconductor layer or substrate used in the described embodiments may be used as an active layer in which various semiconductor devices are formed. The illustration of such semiconductor devices will be omitted in this specification so as to simplify the drawings.

Further, the present invention is not limited to these embodiments, but various variations and modifications may be made without departing from the scope of the present invention.

What is claimed is:

1. A planarization method comprising the steps of:
    forming a second layer on a first layer which has an alignment mark having a heat sink structure, said second layer being made of a metal; and
    irradiating a pulse energy beam on the entire exposed surface of the second layer to planarize the second layer,
    heat generated in the second layer on the alignment mark being released via the first layer so that substantially no melting of the second layer occurs on the alignment mark.

2. The planarization method as claimed in claim 1, wherein said second layer is made of a metal selected from a group consisting of aluminum (Al), titanium (Ti), copper (Cu), tungsten (W) and molybdenum (Mo).

3. The planarization method as claimed in claim 1, wherein said first layer is made of a semiconductor.

4. The planarization method as claimed in claim 1, wherein said alignment mark includes grooves which are formed in the first layer.

5. A planarization method comprising the steps of:
    patterning one or a plurality of second layers which are formed on a first layer having an alignment mark so as to remove the one or the plurality of second layers on the alignment mark thereby exposing the alignment mark provided on the first layer, said alignment mark having a heat sink structure;
    forming a third layer on a top one of the second layers and the exposed surface of the first layer, said third layer being made of a metal; and
    irradiating a pulse energy beam on the entire exposed surface of the third layer to planarize the third layer,
    heat generated in the third layer on the alignment mark being released via the first layer so that substantially no melting of the third layer occurs on the alignment mark.

6. The planarization method as claimed in claim 5, wherein said third layer is made of a metal selected from a group consisting of aluminum (Al), titanium (Ti), copper (Cu), tungsten (W) and molybdenum (Mo).

7. The planarization method as claimed in claim 5, wherein said first layer is made of a semiconductor.

8. The planarization method as claimed in claim 5, wherein said alignment mark includes grooves which are formed in the first layer.

9. A planarization method comprising the steps of:
patterning a second layer which is formed on a first layer so as to form an alignment mark having a heat sink structure thereby exposing a surface of the first layer, said second layer being made of an insulator;
forming a third layer on the second layer and the exposed surface of the first layer; and
irradiating a pulse energy beam on the entire exposed surface of the third layer to planarize the third layer,
heat generated in the third layer on the alignment mark being released via the first layer so that substantially no melting of the third layer occurs on the alignment mark.

10. The planarization method as claimed in claim 9, wherein said third layer is made of a metal selected from a group consisting of aluminum (Al), titanium (Ti), copper (Cu), tungsten (W) and molybdenum (Mo).

11. The planarization method as claimed in claim 9, wherein said first layer is made of a semiconductor.

12. The planarization method as claimed in claim 9, wherein said alignment mark includes grooves which are formed in the second layer and extends to the first layer.

13. A planarization method comprising the steps of:
forming a second layer on a first layer which has an alignment mark, said second layer being made of a metal;
removing the second layer in a vicinity of the alignment mark; and
irradiating a pulse energy beam on the entire exposed surface of the second layer to planarize the second layer.

14. The planarization method as claimed in claim 13, wherein said second layer is made of a metal selected from a group consisting of aluminum (Al), titanium (Ti), copper (Cu), tungsten (W) and molybdenum (Mo).

15. The planarization method as claimed in claim 13, wherein said first layer is made of a semiconductor.

16. The planarization method as claimed in claim 13, wherein said alignment mark includes grooves which are formed in the first layer.

17. A planarization method comprising the steps of:
patterning one or a plurality of second layers which are formed on a first layer having an alignment mark so as to remove the one or the plurality of second layers on the alignment mark thereby exposing the alignment mark provided on the first layer;
forming a third layer on a top one of the second layers and the exposed surface of the first layer, said third layer being made of a metal;
removing the third layer in a vicinity of the alignment mark; and
irradiating a pulse energy beam on the entire exposed surface of the third layer to planarize the third layer.

18. The planarization method as claimed in claim 17, wherein said third layer is made of a metal selected from a group consisting of aluminum (Al), titanium (Ti), copper (Cu), tungsten (W) and molybdenum (Mo).

19. The planarization method as claimed in claim 17, wherein said first layer is made of a semiconductor.

20. The planarization method as claimed in claim 17, wherein said alignment mark includes grooves which are formed in the first layer.

21. A planarization method comprising the steps of:
patterning a second layer which is formed on a first layer so as to form at least an alignment mark thereby exposing a surface of the first layer, said second layer being made of an insulator;
forming a third layer on at least the second layer;
removing the third layer in a vicinity of the alignment mark provided on the second layer; and
irradiating a pulse energy beam on the entire exposed surface of the third layer to planarize the third layer.

22. The planarization method as claimed in claim 21, wherein said third layer is made of a metal selected from a group consisting of aluminum (Al), titanium (Ti), copper (Cu), tungsten (W) and molybdenum (Mo).

23. The planarization method as claimed in claim 21, wherein said first layer is made of a semiconductor.

24. The planarization method as claimed in claim 21, wherein said alignment mark includes grooves which are formed in the second layer and extends to the first layer.

25. The planarization method as claimed in claim 21, wherein said step of patterning the second layer also forms a via hole in the second layer, and said step of removing the third layer leaves the third layer in a vicinity of the via hole so that the third conductor layer which is melted by the energy beam irradiation fills the via hole.

26. A method of producing a semiconductor device comprising the steps of:
patterning one or a plurality of insulator layers which are formed on a semiconductor layer having an alignment mark and a semiconductor device so as to remove the one or the plurality of insulator layers on the alignment mark thereby exposing the alignment mark provided on the semiconductor layer, said alignment mark having a heat sink structure;
forming a metal layer on a top one of the insulator layers and the exposed surface of the semiconductor layer; and
irradiating a pulse energy beam on the entire exposed surface of the metal layer to planarize the metal layer,
heat generated in the metal layer on the alignment mark being released via the semiconductor layer so that substantially no melting of the metal layer occurs on the alignment mark.

27. A method of producing a semiconductor device comprising the steps of:
patterning an insulator layer which is formed on a semiconductor layer having a semiconductor device so as to form an alignment mark having a heat sink structure thereby exposing a surface of the semiconductor layer;
forming a metal layer on the insulator layer and the exposed surface of the semiconductor layer; and
irradiating a pulse energy beam on the entire exposed surface of the metal layer to planarize the metal layer,
heat generated in the metal layer on the alignment mark being released via the semiconductor layer so that substantially no melting of the metal layer occurs on the alignment mark.

28. A method of producing a semiconductor device comprising the steps of:

patterning one or a plurality of insulator layers which are formed on a semiconductor layer having an alignment mark and a semiconductor device so as to remove the one or the plurality of semiconductor layers on the alignment mark thereby exposing the alignment mark provided on the semiconductor layer;

forming a metal layer on a top one of the insulator layers and the exposed surface of the semiconductor layer;

removing the metal layer in a vicinity of the alignment mark; and irradiating a pulse energy beam on the entire exposed surface of the metal layer to planarize the metal layer.

29. A method of producing a semiconductor device comprising the steps of:

patterning an insulator layer which is formed on a semiconductor layer having a semiconductor element so as to form at least an alignment mark thereby exposing a surface of the semiconductor layer;

forming a metal layer on at least the insulator layer;

removing the metal layer in a vicinity of the alignment mark which is provided on the insulator layer; and irradiating a pulse energy beam on the entire exposed surface of the metal layer to planarize the metal layer.

30. The method of producing the semiconductor device as claimed in claim 29, wherein said step of patterning the insulator layer also forms a via hole in the insulator layer, and said step of removing the metal layer leaves the metal layer in a vicinity of the via hole so that the metal layer which is melted by the energy beam irradiation fills the via hole.

* * * * *